United States Patent
Lee et al.

(10) Patent No.: US 7,167,370 B2
(45) Date of Patent: Jan. 23, 2007

(54) FASTENER FOR MOUNTING HEAT-RADIATOR TO ELECTRONIC DEVICE

(75) Inventors: Hsieh Kun Lee, Tu-Chen (TW); Wan-Lin Xia, Shenzhen (CN); Xue-Wen Peng, Shenzhen (CN); Jin-Song Feng, Shenzhen (CN)

(73) Assignees: Fu Zhun Precision Ind (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 302 days.

(21) Appl. No.: 10/950,324

(22) Filed: Sep. 23, 2004

(65) Prior Publication Data

US 2005/0128714 A1 Jun. 16, 2005

(30) Foreign Application Priority Data

Dec. 11, 2003 (CN) .................. 2003 2 1192434

(51) Int. Cl.
*H05K 7/20* (2006.01)
*H01L 23/34* (2006.01)
*A44B 17/00* (2006.01)
*F16B 13/00* (2006.01)

(52) U.S. Cl. .................. 361/719; 24/294; 411/509; 257/719

(58) Field of Classification Search .................. 24/294; 361/710, 719; 257/718–719; 411/508–509
See application file for complete search history.

(56) References Cited

U.S. PATENT DOCUMENTS

| 4,710,852 A | * | 12/1987 | Keen | 361/717 |
| 6,219,244 B1 | * | 4/2001 | Chen | 361/704 |
| 6,249,436 B1 | * | 6/2001 | Bollesen | 361/720 |
| 6,301,113 B1 | * | 10/2001 | Guerrero | 361/704 |
| 6,418,025 B1 | * | 7/2002 | Lee | 361/719 |
| 6,496,371 B1 | * | 12/2002 | Winkel et al. | 361/703 |
| 6,568,464 B1 | * | 5/2003 | He et al. | 165/80.3 |

* cited by examiner

*Primary Examiner*—Greg Thompson
(74) *Attorney, Agent, or Firm*—Wei Te Chung

(57) ABSTRACT

A fastener (10) for mounting a heat-radiator (20) to an electronic device (30) on a circuit board (40) is disclosed. The heat-radiator and the circuit board have aligned holes (22, 44). The fastener includes a head (11) having an upper portion (112) with a large diameter and a lower portion (113) with a smaller diameter, a cylindrical spring (14) captured around the lower portion of the head for exerting a spring force against the heat-radiator, and a metallic wire (15) having a first end portion fixed on said head and a second end portion bent to form an engaging portion (152). The engaging portion of the metallic wire compressively passes through the aligned holes of the heat-radiator and the circuit board and is engaged with an underside of the circuit board.

15 Claims, 4 Drawing Sheets

FASTENER FOR MOUNTING HEAT-RADIATOR TO ELECTRONIC DEVICE

BACKGROUND OF THE INVENTION

1. Field of the Invention

The present invention relates to a fastener, and more particularly to a fastener used for mounting a heat-radiator to an electronic device on a circuit board.

2. Description of Prior Art

Electronic devices such as central processing units (CPUs) are the core administrator of electrical signals in most contemporary personal computers. Continued development of CPUs has enabled them to perform more and more functions. Heat generated by CPUs has increased commensurately. Such heat can adversely affect the operational stability of computers. Measures must be taken to efficiently remove the heat from the CPUs. Typically, a heat-radiator is mounted on a CPU to remove heat therefrom.

A number of conventional fasteners are used to mount the heat-radiator to the CPU. The fasteners extend through holes in the heat-radiator and the circuit board, and are constructed to exert a spring force that presses the heat-radiator against the CPU. As shown in FIG. 5, conventional fasteners 120 for mounting a heat-radiator 110 to a CPU 130 installed on a circuit board 140 are disclosed. The fastener 120 has a leg 122, a head 124 formed at a first end of the leg 122 and a cone-shaped foot 126 formed at a second end of the leg 122. The foot 126 has an engaging portion at a top thereof and an insertion end at a bottom thereof. Both the head 124 and the engaging portion of the foot 126 have a diameter larger than the leg 122, whereas the insertion portion of the foot 126 has a diameter smaller than the leg 122. A cylindrical spring 127 is located around a periphery of the leg 122 and between the head 124 and the foot 126. A channel 128 is longitudinally defined through the foot 126 and at least a portion of the leg 122 adjacent to the foot 126. Thus when the heat-radiator 110 is mounted, the foot 126 of the fastener 120 is squeezed to sequentially travel through corresponding holes in the heat-radiator 110 and the circuit board 140. After the engaging portion of the foot 126 extends the hole of the circuit board 140, the foot 126 recovers to its original state whereby the engaging portion of the foot 126 is engaged with an underside of the circuit board 140. At the same time, the spring 127 is pressed to push against a top surface of the heat-radiator 110. Thus the heat-radiator 110 is mounted on the CPU 130 for heat dissipation.

However, the fastener 120 is usually integrally made from plastic material by injection molding method. The engaging portion of the foot 126 of the fastener 120 has a tendency of wearing out during insertion action. The heat-resistance property of the fastener 120 is also not satisfactory. When used at a high temperature environment, the engaging portion of the foot 126 is prone to deform overly, and as a result, the heat-radiator 110 become loose or even dropped from the circuit board 140.

Therefore, it is desired to provide an improved fastener to obviate the aforementioned problems.

SUMMARY OF THE INVENTION

Accordingly, an object of the present invention is to provide a fastener which can securely fasten a heat-radiator to an electronic device on a circuit board.

In order to achieve the object set out above, a fastener in accordance with the present invention is used for mounting a heat-radiator to an electronic device on a circuit board. The heat-radiator and the circuit board have aligned holes. The fastener comprises a head, an elastic member and a metallic wire. The head has an upper portion with a large diameter and a lower portion with a smaller diameter. The elastic member is a cylindrical spring captured around said lower portion of said head and beneath said upper portion for urging the heat-radiator towards the electronic device. A first end portion of the metallic wire is fixed on the head and a second end portion thereof is bent to form an engaging portion. The engaging portion of the metallic wire can compressively and sequentially pass through corresponding holes of the heat-radiator and the circuit board to engage with an underside of the circuit board. The spring exerts a spring force on the heat-radiator towards the electronic device. Thus, the heat-radiator is firmly mounted to the electronic device for heat dissipation.

Other objects, advantages and novel features of the present invention will become more apparent from the following detailed description when taken in conjunction with the accompanying drawings, in which:

DETAILED DESCRIPTION OF THE INVENTION

Figure 1:
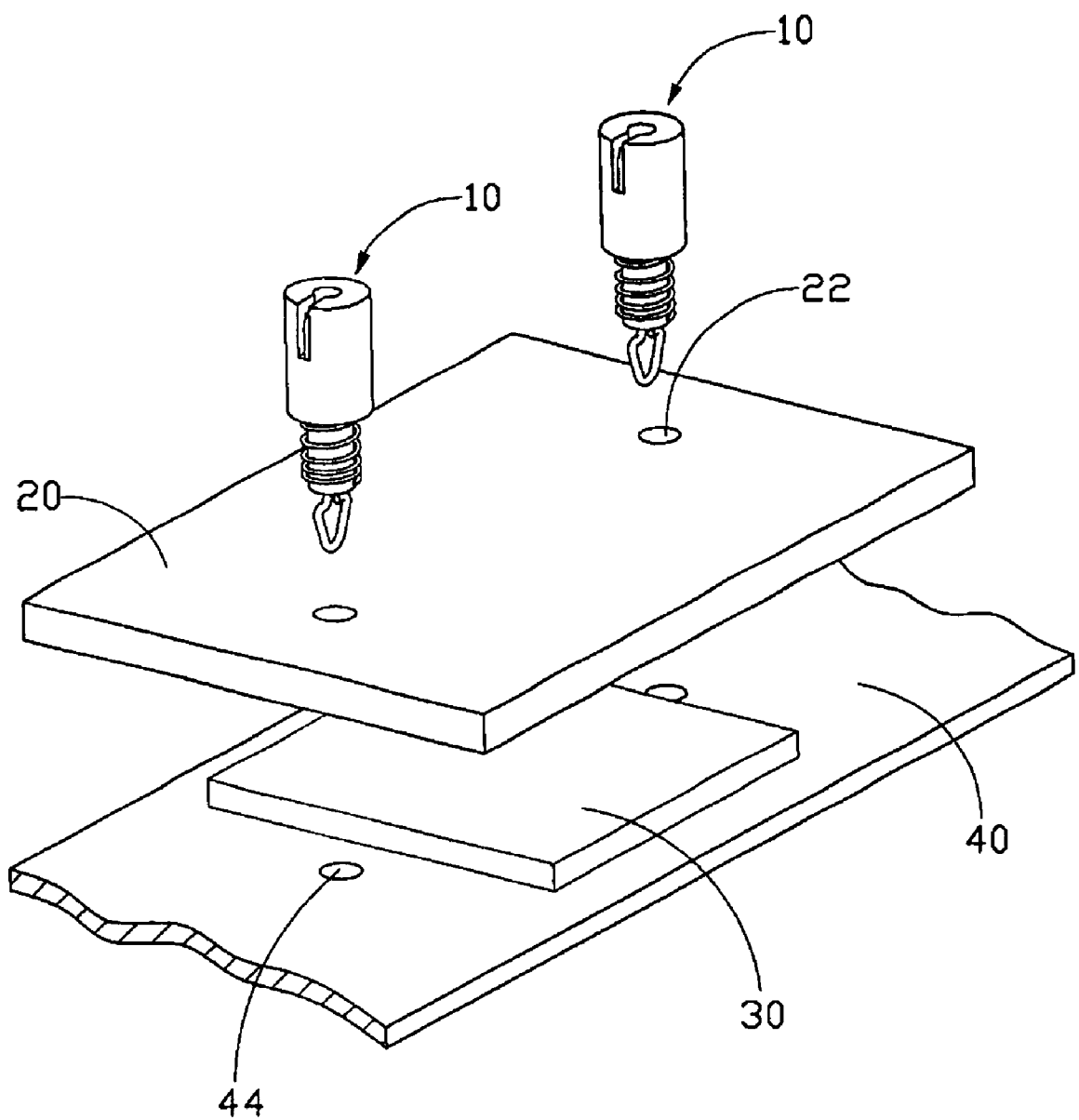
FIG. 1 is a perspective view shows a pair of fasteners in accordance with the present invention to fasten a heat-radiator on an electronic device on a circuit board.

Reference will now be made to the drawing figures to describe the present invention in detail.

FIG. 1 shows a pair of fasteners 10 in accordance with the present invention, for mounting a heat-radiator 20 to an electronic device 30 which is installed on a circuit board 40. The heat-radiator 20 and the circuit board 40 have aligned holes 22, 44 defined thereon.

Figure 2:
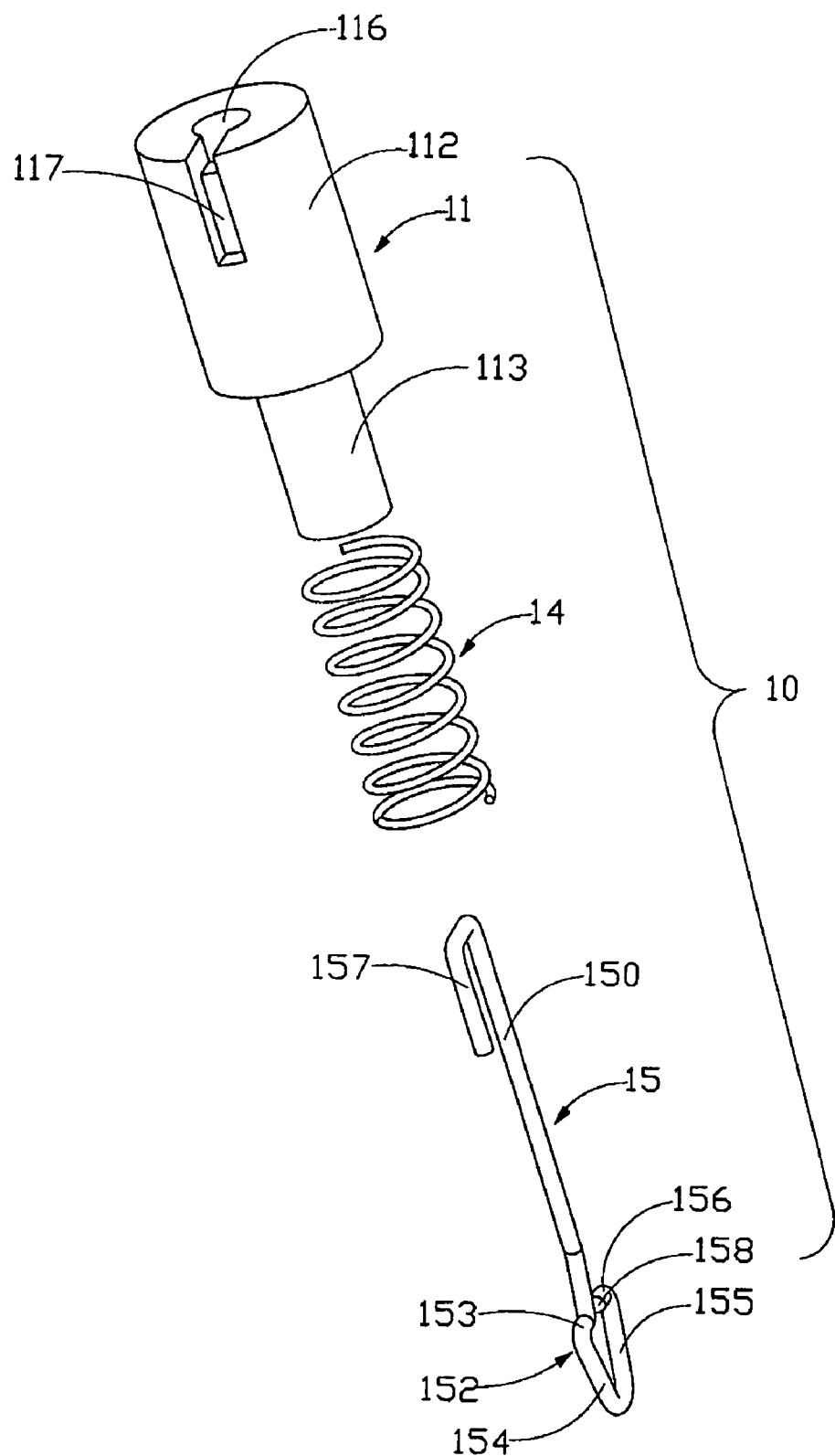
FIG. 2 is an exploded view of a fastener of FIG. 1.

Referring also to FIG. 2, the fastener 10 comprises a head 11 and a metallic wire 15. The head 11 has an upper portion 112 and a lower portion 113 connected with the upper portion 112. Both the upper and lower portions 112, 113 of the head 11 have a cylindrical profile. The upper portion 112 has a larger diameter than the lower portion 113, and the diameter of the lower portion 113 is corresponding to that of the holes 22, 44 of the heat-radiator 22 and the circuit board 40. A straight hole 116 is defined longitudinally through a center of the upper and lower portions 112, 113 of the head 11. A slot 117 is defined at a top and outside surface of the upper portion 112 of the head 11 and is communicated with the hole 116 at the top surface of the upper portion 112. A first end portion of the metallic wire 15 including a stem 150 is inserted through the hole 116 of the head 11, and is bent successively and downwardly to form a fixing end 157. The fixing end 157 is received in the slot 117 for fixing the metallic wire 15 therein. A second end portion of the metallic wire 15 is bent to form an engaging portion 152. The engaging portion 152 is formed by bending the second end portion of the metallic wire 15 outwardly to form a first support 153, and then bending it downwardly and inwardly to form a first leg 154, and then bending it to form a second leg 155 and a second support 156 which are symmetrical to the first leg 154 and the first support 153, leaving a gap 158 existed between the first and second supports 153, 156. A maximum width between the first and second supports 153, 156 is larger than the diameter of the holes 22, 44 of the heat-radiator 20 and the circuit board 40. An elastic member, preferably a cylindrical spring 14 is located around the lower portion 113 of the head 11 and beneath the upper portion 112 thereof, although other elastic member such as metal sheet is also practical. Suitably, at least partially of the spring 14 is received in an annular groove 118 (See FIG. 3) defined at a conjunction of the upper portion 112 and the lower portion 113 of the head 11.

Figure 3:
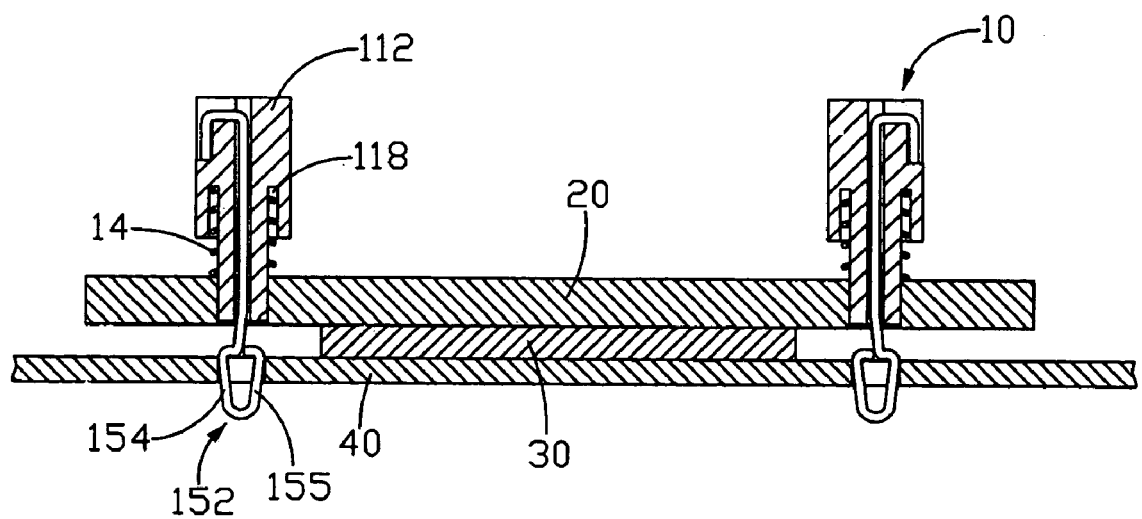
FIG. 3 is a side sectional and a partly assembled view of FIG. 1.
Figure 4:
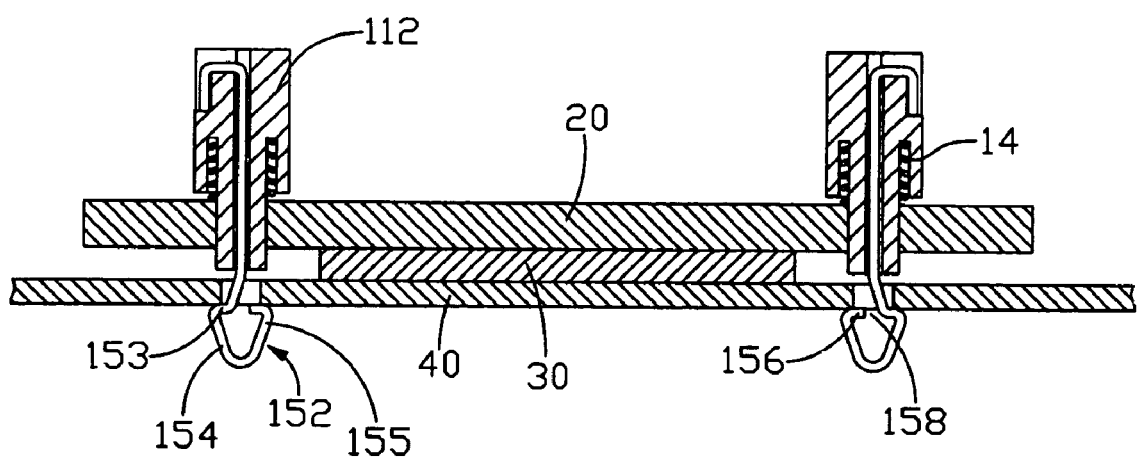
FIG. 4 is a side sectional and a completely assembled view of FIG. 1.
Figure 5:
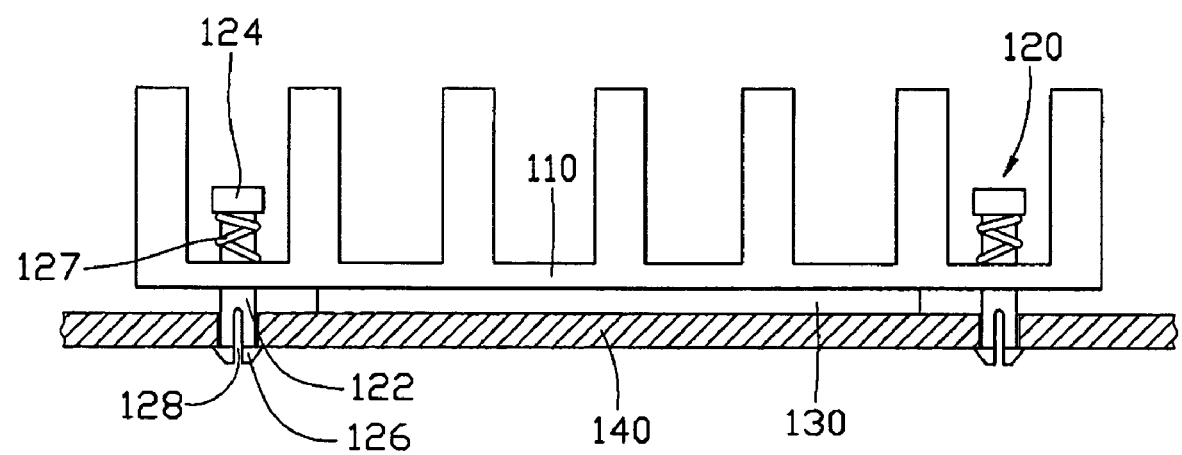
FIG. 5 is a partly sectional view of a conventional fastener fastening a heat-radiator on a circuit board.

Referring also to FIG. 3 and FIG. 4, when used, the fastener 10 is disposed on the heat-radiator 20 with the engaging portion 152 of the metallic wire 15 facing the holes 22, 44 of the heat-radiator 20 and the circuit board 40. The upper portion 112 of the head 11 is then pushed downwardly. The first and second legs 154, 155 of the engaging portion 152 of the metallic wire 15 are squeezed to sequentially travel through the holes 22, 44 of the heat-radiator 20 and the circuit board 40. After the engaging portion 152 of the metallic wire 15 extends through the hole 44 of the circuit board, the engaging portion 152 recovers to its original state whereby the first and second supports 153, 156 of the engaging portion 152 are engaged with an underside of the circuit board 40. At the same time, the spring 14 is compressed to push against a top surface of the heat-radiator 20. Thus, the heat-radiator 20 is firmly secured to the electronic device 30 for heat dissipation.

In comparison with conventional fasteners made from plastic materials, the engaging portion 152 of the fastener 10 of the present invention is made from metallic wire. Consequently, it can prevent the engaging portion 152 of the fastener 10 from wearing out during frequently insertion actions. Also the engaging portion 152 of the fastener 10 has good heat-resistance property and can prevent from deforming overly when used at a high temperature environment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener for mounting a heat-radiator to an electronic device on a circuit board, the heat-radiator and the circuit board having aligned holes, the fastener comprising:
   a head for exerting a force to the heat-radiator,
   a metallic wire having a substantially straight first end portion fixed on said head and a second end portion bent to form an engaging portion, said engaging portion adapted for compressively passing through the aligned holes of the heat-radiator and the circuit board to engage with an underside of the circuit board and an elastic member attached to the head for urging the heat-radiator towards the electronic device.

2. The fastener of claim 1, wherein the elastic member is a cylindrical spring.

3. The fastener of claim 2, wherein the head comprises an upper portion with a large diameter and a lower portion with a smaller diameter, and the spring is captured around said lower portion.

4. The fastener of claim 3, wherein an annular groove is defined at a conjunction of the upper portion and the lower portion of the head to at least partially receive the spring therein.

5. The fastener of claim 1, wherein the head has a straight hole defined longitudinally through a center of the head for the first end portion of the metallic wire traveling therethrough.

6. The fastener of claim 4, wherein a slot is defined at a top and outside surface of the head and a distal portion of the first end portion of the metallic wire is received and fixed therein after traveling through the hole of the head.

7. The fastener of claim 1, wherein the engaging portion of the metallic wire has an inverted taper profile and is formed by bending the second end portion of the metallic wire outwardly to form a first support and then bending it downwardly and inwardly to form a first leg, and then bending it to form a second leg and a second support which are symmetrical to the first leg and the first support, with a gap existed between the first and second supports.

8. A heat dissipating device for an electronic device on a circuit board, the circuit board having through holes defined thereon, the heat dissipating device comprising:
   a heat-radiator located on the electronic device and defining through holes aligned with the holes of the circuit board; and
   a fastener for attaching the heat-radiator to the electronic device, the fastener comprising:
   a head extending through one of the through holes of the heat-radiator;
   an elastic member attached to the head for exerting a spring force on the heat-radiator toward the electronic device; and
   a metallic wire having a first end portion fixed on said head and a second end portion bent to form an engaging portion, the engaging portion compressively passing through corresponding through holes of the heat-radiator and the circuit board to engage with an underside of the circuit board whereby the electronic device is securely sandwiched between the heat-radiator and the circuit board.

9. The heat dissipating device of claim 8, wherein the engaging portion of the metallic wire has an inverted taper profile and is formed by bending the second end portion of the metallic wire outwardly to form a first support, and then bending it downwardly and inwardly to form a first leg, and then bending it to form a second leg and a second support which are symmetrical to the first leg and the first support, with a gap existed between the first and second supports.

10. The heat dissipating device of claim 8, wherein the head has a straight hole defined longitudinally through a center of the head for the first end portion of the metallic wire traveling therethrough.

11. The heat dissipating device of claim 10, wherein a slot is defined at a top and outside surface of the head for receiving and fixing the first end portion of the metallic wire therein after traveling through the hole of the head.

12. The heat dissipating device of claim 8, wherein the elastic member is a cylindrical spring.

13. The heat dissipating device of claim 12, wherein the head comprises an upper portion with a large diameter and a lower portion with a smaller diameter, and the spring is captured around said lower portion and at least partially received in an annular groove defined at a conjunction of the upper portion and the lower portion.

14. The heat dissipating device of claim 8, wherein the second end portion of the metallic wire is located bellow the circuit board.

15. A heat dissipating device assembly comprising:
a printed circuit board defining at least a first through hole;
a heat generating device located upon the printed circuit board and beside said first through hole;
a heat dissipating device seated upon the heat generating device and comprising:
a heat-radiator located on the heat generating device and defining at least a second through hole aligned with the first through hole; and
a fastener for pressing the heat-radiator against the heat generating device, the fastener comprising:
a metal piece extending through both said first and second through holes with a hook upwardly abutting against a back face of the printed circuit board around said first through hole;
a head extending through the second through hole and defining a section retainably engaged with an upper section of the metal piece opposite to said hook; and
an elastic member defining an upper end urging the associated head and metal piece upwardly and a lower end urging the heat radiator downwardly.

\* \* \* \* \*